United States Patent
Kim et al.

(10) Patent No.: US 8,881,996 B2
(45) Date of Patent: Nov. 11, 2014

(54) SWING NOZZLE UNIT AND SUBSTRATE PROCESSING APPARATUS WITH SWING NOZZLE UNIT

(75) Inventors: Taeho Kim, Cheonan-si (KR); Boong Kim, Cheonan-si (KR); Youngju Jeong, Asan-si (KR)

(73) Assignee: Semes Co., Ltd., Chungcheongnam-Do (KR)

(*) Notice: Subject to any disclaimer, the term of this patent is extended or adjusted under 35 U.S.C. 154(b) by 505 days.

(21) Appl. No.: 12/883,433

(22) Filed: Sep. 16, 2010

(65) Prior Publication Data

US 2011/0068200 A1 Mar. 24, 2011

(30) Foreign Application Priority Data

Sep. 21, 2009 (KR) .................... 10-2009-0089121

(51) Int. Cl.
*B05B 9/00* (2006.01)
*H01L 21/67* (2006.01)

(52) U.S. Cl.
CPC .............................. *H01L 21/67051* (2013.01)
USPC ....................................... 239/140; 239/225.1

(58) Field of Classification Search
CPC ............ B05B 1/00; B05B 1/005; B05B 1/02; B05B 1/06; F16L 9/00; F16L 9/04; F16L 9/18; F16L 11/02
USPC ........... 239/140, 537–538, DIG. 14, DIG. 19, 239/436–438, 589, 225.1; 427/240, 346, 427/558
See application file for complete search history.

(56) References Cited

U.S. PATENT DOCUMENTS

| | | | | |
|---|---|---|---|---|
| 4,938,383 A | * | 7/1990 | Yamazaki et al. | 222/41 |
| 2002/0094384 A1 | * | 7/2002 | Leonard | 427/359 |
| 2003/0054098 A1 | * | 3/2003 | Chang et al. | 427/240 |
| 2008/0093346 A1 | * | 4/2008 | Yamaguchi et al. | 219/121.49 |
| 2008/0251107 A1 | * | 10/2008 | Osada et al. | 134/201 |

FOREIGN PATENT DOCUMENTS

| | | |
|---|---|---|
| JP | H07-211625 | 8/1995 |
| JP | 2000-070874 | 3/2000 |
| JP | 2003-093984 | 4/2003 |
| JP | 2008-118109 A | 5/2008 |
| KR | 10-2006-0061816 | 6/2006 |
| TW | 200828426 | 7/2008 |

* cited by examiner

*Primary Examiner* — Davis Hwu
(74) *Attorney, Agent, or Firm* — Harness, Dickey & Pierce, P.L.C.

(57) ABSTRACT

Provided is a single wafer processing apparatus for cleaning a substrate. The apparatus includes a substrate support member including a spin head to place a substrate thereon, a processing bowl disposed to surround the spin head and adapted to collect a processing fluid scattering from the substrate, and a swing nozzle unit adapted to inject the processing fluid to the substrate placed on the spin head by rotating in a swinging motion, wherein the swing nozzle unit includes a nozzle part including a nozzle body constituted by an inner resin pipe supplying an inner path where a processing fluid supply tube is disposed, a metal pipe disposed to surround the inner resin pipe, and an outer resin pipe disposed to surround the metal pipe, and a nozzle driver adapted to rotate the nozzle part in a θ-axis direction and move the nozzle part up and down in a z-axis direction.

8 Claims, 7 Drawing Sheets

SWING NOZZLE UNIT AND SUBSTRATE PROCESSING APPARATUS WITH SWING NOZZLE UNIT

CROSS-REFERENCE TO RELATED APPLICATIONS

This U.S. non-provisional patent application claims priority under 35 U.S.C. §119 of Korean Patent Application No. 10-2009-0089121 filed on Sep. 21, 2009, the entire contents of which are hereby incorporated by reference.

BACKGROUND

The present disclosure herein relates to a substrate processing apparatus, and more particularly, to a swing nozzle unit which injects a processing fluid to clean a substrate and a substrate processing apparatus with the swing nozzle unit.

Generally, as semiconductor devices have a tendency to high density, high integration, and high performance, size reduction of a circuit pattern is rapidly progressing. Therefore, contaminating substances such as particles, organic contaminants, and metal contaminants remain on a substrate surface, which considerably affects property of the device and the production yield. To this end, importance of a cleaning process to remove various contaminants attached to the substrate surface and unnecessary films is increasing. The substrate cleaning process is performed before and after every unit process for manufacturing a semiconductor.

Cleaning methods currently used for the semiconductor manufacturing include a dry cleaning and a wet cleaning. The wet cleaning is divided into a bath type which removes contaminants through chemical dissolution by immersing a substrate in a chemical treatment fluid, and a single wafer type which removes contaminants by rotating a substrate placed on a spin chuck and supplying a chemical treatment fluid to a substrate surface.

A single wafer cleaning apparatus uses various types of cleaning liquid according to the contaminants and kinds of films to remove. The cleaning liquid is supplied to the substrate selectively by a swing nozzle or a static nozzle.

The swing nozzle may be made of resin or metal. A resin nozzle has excellent corrosion-resistance in spite of having low rigidity. A metal nozzle has excellent rigidity but is subject to corrosion. Usually, the swing nozzle is made of metal to secure the rigidity and surface-processed to prevent corrosion. However, an inner diameter surface of a metal pipe cannot be processed due to characteristics of a surface process. Therefore, corrosion may occur at the inner diameter surface of the metal pipe.

SUMMARY

The present disclosure provides a swing nozzle unit having high rigidity and corrosion-resistance and a substrate processing apparatus with the swing nozzle unit.

The present disclosure also provides a swing nozzle unit capable of preventing corrosion while using a metal pipe, and a substrate processing apparatus with the swing nozzle unit.

The object of the present disclosure is not limited to the above. Other objects, features and advantages not described herein will be clearly understood by those skilled in the art from the following description.

Embodiments of the inventive concept provide swing nozzle units including a nozzle part including a nozzle body in the form of a rod supplying an inner path where a processing fluid supply tube is disposed, wherein the nozzle body includes an inner resin pipe; a metal pipe disposed to enclose the inner resin pipe; and an outer resin pipe disposed to enclose the metal pipe.

In some embodiments, the nozzle part may further include a sealing cap which includes a through hole disposed in a center thereof to pass the processing fluid supply tube and is mounted to one end of the inner resin pipe and one end of the outer resin pipe so that one end of the metal pipe is not exposed to the outside.

In other embodiments, the nozzle part may include a nozzle tip mounted to the sealing cap to hold the processing fluid supply tube.

In still embodiments, the one end of the inner resin pipe and the one end of the outer resin pipe may protrude more than the one end of the metal pipe.

In even other embodiments, the nozzle part may further include a flange mounted to the other end of the nozzle body, and the swing nozzle unit may further include a nozzle driver connected with the flange to rotate and move up and down the nozzle part.

In yet other embodiments, the flange may include an insertion hole to insert the other end of the nozzle body, and further include fixing members to fix the other end of the nozzle body inserted in the insertion hole.

In further other embodiments, the fixing members may be screws inserted from a side surface of the flange.

In still further embodiments, the screws may be fastened by passing through the outer resin pipe and the metal pipe.

In other embodiments of the inventive concept, substrate processing apparatuses including a substrate support member including a spin head on which a substrate is placed; a processing bowl disposed to surround the spin head and adapted to collect a processing fluid scattering from the substrate; and swing nozzle units adapted to inject the processing fluid to the substrate placed on the spin head by rotating in a swinging motion, wherein each of the swing nozzle unit includes a nozzle part including a nozzle body constituted by an inner resin pipe supplying an inner path where a processing fluid supply tube is disposed, a metal pipe disposed to enclose the inner resin pipe, and an outer resin pipe disposed to enclose the metal pipe; and a nozzle driver adapted to rotate and move up and down the nozzle part.

In other embodiments, the nozzle part may include a sealing cap which includes a through hole disposed in a center thereof to pass the processing fluid supply tube and is mounted to one end of the inner resin pipe and one end of the outer resin pipe so that one end of the metal pipe is not exposed to the outside.

In still other embodiments, the sealing cap may be made of the same resin material as the inner resin pipe and the outer resin pipe for efficient heat fusion with the inner resin pipe and the outer resin pipe.

In even other embodiments, the nozzle part may further include a nozzle tip which is connected with the sealing cap and includes a fixing hole to insert and fix one end of the processing fluid supply tube therein.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
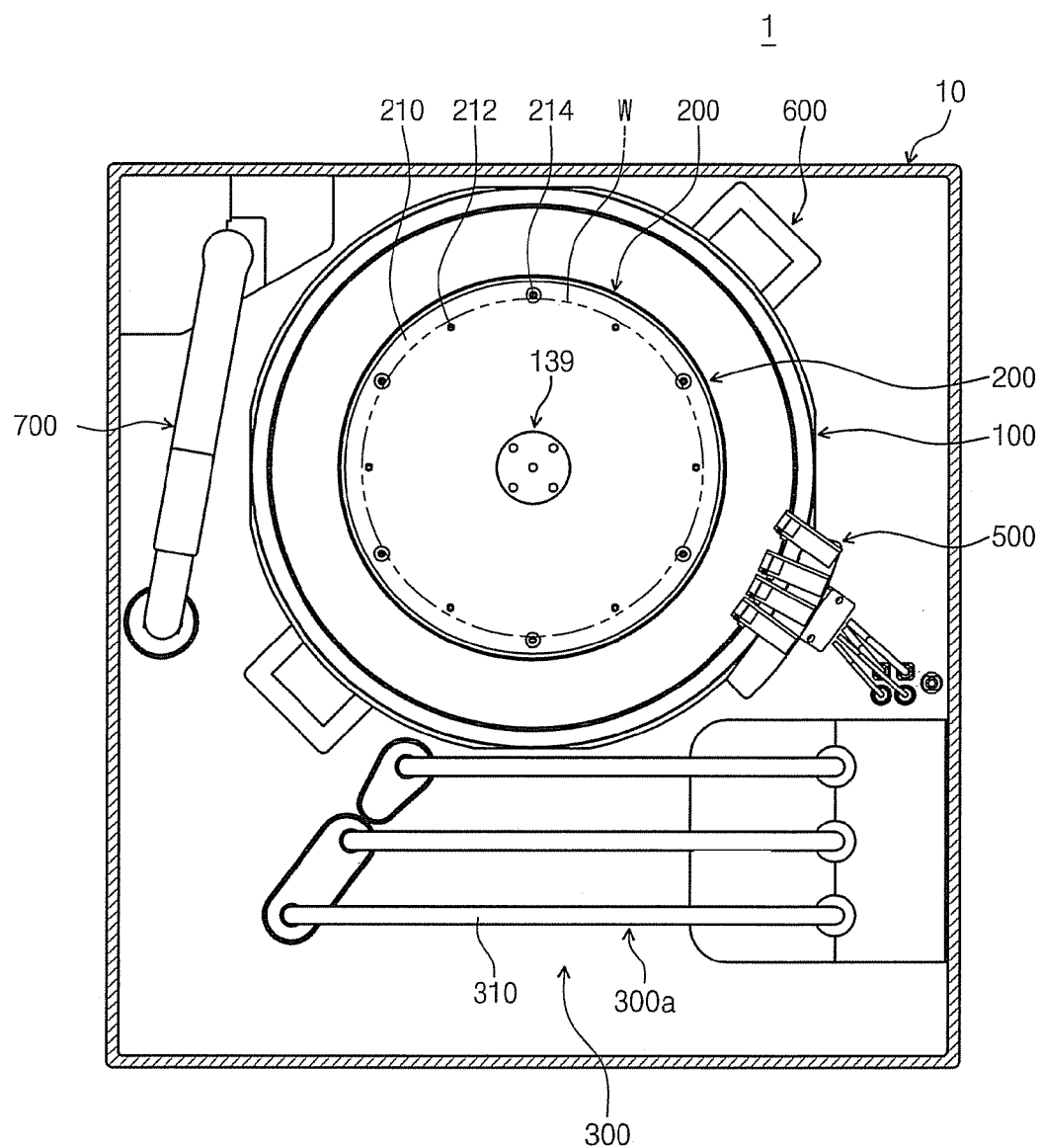
FIG. 1 is a plan view showing the structure of a single wafer processing apparatus according to an embodiment of the inventive concept.

Hereinafter, exemplary embodiments of a single wafer processing apparatus will be described in detail with reference to the accompanying drawings. The same elements are cited by the same reference numerals throughout the drawings. In the following description, well-known structures and functions will not be explained in detail not to obscure the disclosure.

In the embodiments described below, a processing fluid may include an aqueous solution or a mixture of hidryfluoric acid (HF), sulfuric acid ($H_3SO_4$), nitric acid ($HNO_3$), phosphoric acid ($H_3PO_4$), SC-1 soludiont (mixture of ammonium hydroxide ($NH_4OH$), hydrogen peroxide ($H_2O_2$), and water ($H_2O$)), ozone water, reduced water, ion water, and alkaline solution.

EMBODIMENT

Figure 2:
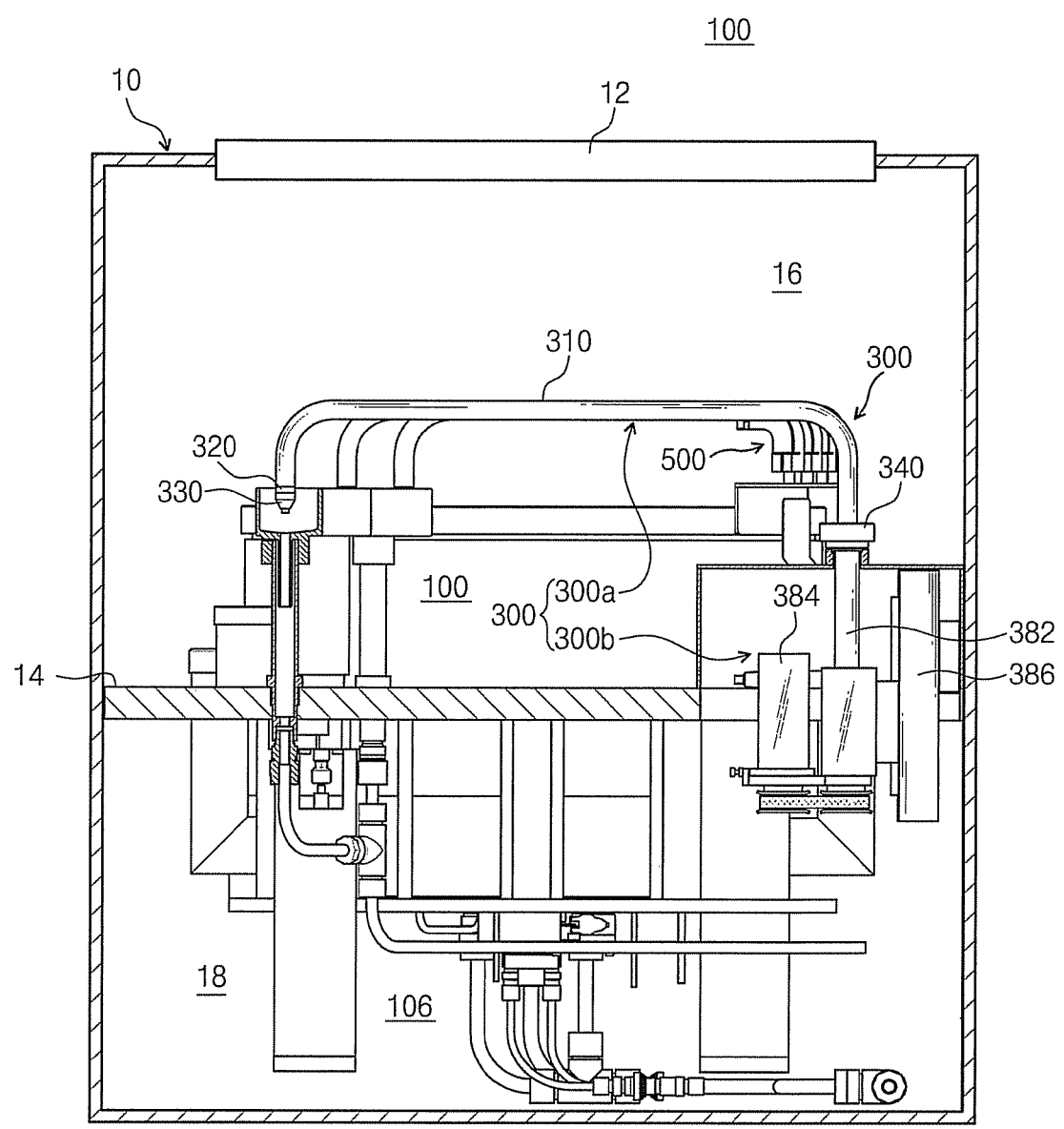
FIG. 2 is a side view showing the structure of the single wafer processing apparatus according to the embodiment of the inventive concept.
Figure 3:
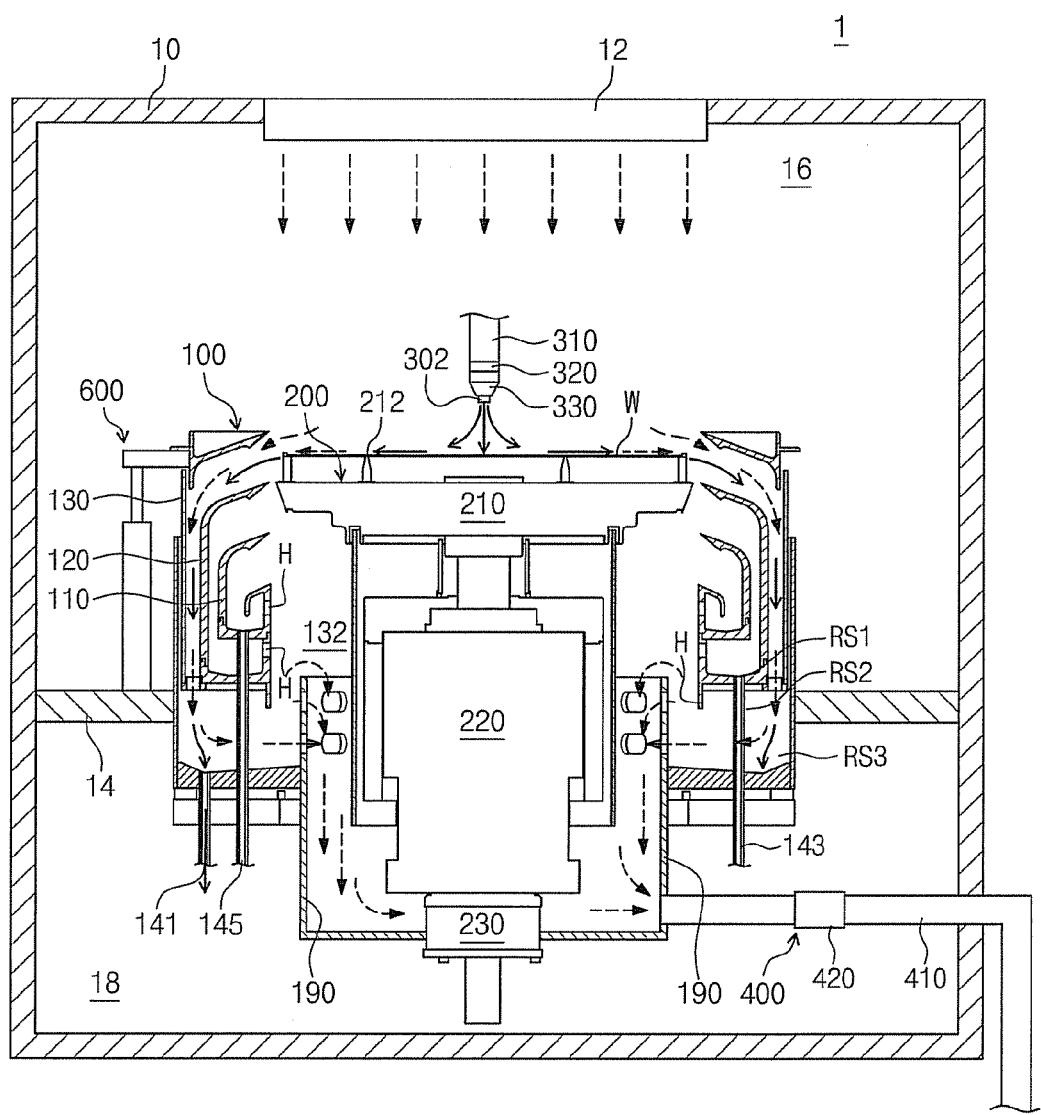
FIG. 3 is a side sectional view showing a bowl of the substrate processing apparatus shown in FIG. 1.

FIG. 1 is a plan view showing the structure of a single wafer processing apparatus according to an embodiment of the inventive concept. FIG. 2 is a side view showing the structure of the single wafer processing apparatus according to the embodiment of the inventive concept. FIG. 3 is a side sectional view showing a bowl of the substrate processing apparatus shown in FIG. 1.

Although a semiconductor substrate is illustrated and explained as an example of a substrate processed by the single water type substrate processing apparatus 1 in this embodiment, the disclosure is not limited thereto but applicable to various other types of substrate including a glass substrate for a liquid crystal display (LCD) device.

Referring to FIGS. 1 through 3, the single wafer processing apparatus 1 is adapted to remove foreign substances and films remaining on a substrate surface by using various processing fluids. The substrate processing apparatus 1 includes a chamber 10, a processing bowl 100, a substrate support member 200, first swing nozzle units 300, static nozzle units 500, a second swing nozzle unit 700, and an exhaust member 400.

The chamber 10 provides a hermetic inner space. A fan filter unit 12 is mounted at an upper part of the chamber 10 to generate a vertical air current in the chamber 10.

The fan filter unit 12 is modularized into a single unit including a filter and an air supply fan. The fan filter unit 12 filters off clean air and supplies the filtered air into the chamber 10. The clean air passed through the fan filter unit 12 and supplied into the chamber 10 forms the vertical air current in the chamber 10. The vertical air current supplies air currents uniformly to an upper part of the substrate. Therefore, contaminants (fume) generated during a surface processing of the substrate using the processing fluid are discharged to the exhaust member 400 along with air through suction ducts of the processing bowl 100, thereby being removed. Accordingly, high air purity in the processing bowl 100 may be maintained.

The chamber 10 is separated into a processing area 16 and a maintenance area 18 by a horizontal partition 14. Although partially shown in the drawings, the maintenance area 18 includes not only discharge lines 141, 143, and 145 connected with the processing bowl 100, and a sub air discharge line 410, but also a driver of an elevating unit 600, a driver 300b of the first swing nozzle unit 300, a feeding line, and so forth. It is exemplary that the maintenance area 18 is isolated from the processing area where the substrate is processed.

The processing bowl 100 has a cylindrical shape with an opening on top and supplies a space for processing of a substrate W. The top opening of the processing receptacle 100 serves as a path for passage of the substrate W. The substrate support member 200 is disposed in the processing bowl 100. The substrate support member 200 supports and rotates the substrate W during the processing.

Hereinafter, the processing bowl 100 and the substrate support member 200 will be described in further detail.

FIG. 3 is a sectional view of the processing bowl and the substrate support member shown in FIG. 1.

Referring to the drawing, the processing bowl 100 includes an upper space 132a in which a spin head 210 is disposed, and a lower space 132b separated from the upper space 132a by the spin head 210 and connected with an exhaust duct 190 by a lower end thereof for forcibly discharging air. The upper space 132a of the processing bowl 100 includes first, second, and third suction ducts 110, 120, and 130 having an annular shape and arranged in a multistage manner to draw in the processing fluid, gas, fume and so forth scattering from the rotating substrate W. The annular first, second, and third suction ducts 110, 120, and 130 each have an air vent H. The air vents H commonly communicate with one annular space corresponding to a lower space of the processing receptacle 100. The lower space 132b includes the exhaust duct 190 in connection with the exhaust member 400.

More specifically, each of the first to the third suction ducts 110, 120, and 130 includes a bottom surface having an annular shape and a sidewall extending from the bottom wall into a cylindrical shape. The second suction duct 120 surrounds the first suction duct 110 at a distance from the first suction duct 110. The third suction duct 130 surrounds the second suction duct 120 at a distance from the second suction duct 120.

The first to the third suction ducts 110, 120, and 130 supply first to third collecting spaces RS1, RS2, and RS3, respectively, into which gas containing the processing fluid and fume scattering from the substrate W flows. The first collecting space RS1 is defined by the first suction duct 110. The second collecting space RS2 is defined as a space formed between the first suction duct 110 and the second suction duct 120. The third collecting space RS3 is defined as a space formed between the second suction duct 120 and the third suction duct 130.

Upper surfaces of the first to the third suction ducts 110, 120, and 130 are inclined surfaces, each of which include an opening in the center and are configured such that a distance from an adjoining sidewall to a corresponding bottom surface increases toward the opening. Accordingly, the processing fluid scattering from the substrate W may flow into the collecting spaces RS1, RS2, and RS3 along the upper surfaces of the first to the third suction ducts 110, 120, and 130.

A first processing fluid flowing into the first collecting space RS1 is discharged to the outside through a first discharge line 141. A second processing fluid flowing into the second collecting space RS2 is discharged to the outside through a second discharge line 143. A third processing fluid flowing into the third collecting space RS3 is discharged to the outside through a third discharge line 145.

The processing bowl 100 is connected to the elevating unit 600 which varies a vertical position of the processing bowl 100. That is, the elevating unit 600 linearly moves the processing bowl 100 up and down. As the processing bowl 100 moves up and down, a height of the processing bowl 100 relative to the spin head 210 is varied. When the substrate W is loaded to or unloaded from the spin head 210, the processing bowl 100 is moved down so that the spin head 210 protrudes upward from an upper part of the processing bowl 100. During the surface processing, the height of the processing bowl 100 is adjusted such that the processing fluid may flow into a predetermined one of the suction ducts 110, 120, and 130 according to types of the processing fluid supplied to the substrate W. According to this, relative vertical positions between the processing bowl 100 and the substrate W are varied. Thus, the processing bowl 100 is capable of handling different types of the processing fluid and contaminated gas to be collected according to the collecting spaces RS1, RS2, and RS3.

In the present embodiment, the substrate processing apparatus 1 moves the processing bowl 100 in a vertical direction to vary relative vertical positions between the processing bowl 100 and the substrate support member 200. However, the substrate processing apparatus 1 may vary the relative vertical positions between the processing bowl 100 and the substrate support member 200 by vertically moving the substrate support member 200.

The substrate support member 200 is mounted in the processing bowl 100. The substrate support member 200 supporting the substrate W during the processing may be rotated by a driver 240 that will be described later. The substrate support member 200 includes the spin head 210 having a circular upper surface. The upper surface of the spin head 210 includes supporting pins 212 and chucking pins 214 supporting the substrate W. The supporting pins 212 are arranged at predetermined intervals along a edge of the upper surface of the spin head 210 to protrude upward from the spin head 210. The support pins 212 support a lower surface of the substrate W such that the substrate W is spaced upward from the spin head 210. The chucking pins 214 are arranged at outer positions than the supporting pins 212 and protruded upward. The chucking pins 214 align the substrate W supported by the supporting pins 212 with a correct position of the spin head 210. During the processing, the chucking pins 214 contact a side of the substrate W, thereby preventing the substrate W from deviating from the correct position.

A support shaft 220 is connected to a lower part of the spin head 210 to support the spin head 210. The support shaft 220 is rotated by a driver 230 which is in connection with a lower end thereof. The driver 230 may be a motor. According to rotation of the support shaft 220, the spin head 210 and the substrate W are rotated.

The exhaust member 400 supplies a discharge pressure (suction pressure) to the first to the third suction ducts 110, 120, and 130 during the processing. The exhaust member 400 includes the sub air discharge line 410 connected with the exhaust duct 190, and a damper 420. The sub air discharge line 410 is supplied with a discharge pressure from an exhaust pump (not shown) and connected with a main air discharge line embedded in a bottom space of a semiconductor production line (fab).

The static nozzle units 500 are fixed to an upper end of the processing bowl 100 and adapted to supply ultrapure water, ozone water, nitrogen, and so forth to the center of the substrate W.

The second swing nozzle unit 700 is moved by swinging to an upper center part of the substrate W to supply a fluid for drying the substrate W. The substrate drying fluid may include isopropyl alcohol and high-temperature nitrogen.

The first swing nozzle units 300 are disposed at outer positions of the processing bowl 100. The first swing nozzle units 300 rotate in a boom swinging manner and supply the substrate W placed on the spin head 210 with the processing fluid (acid liquid, alkaline liquid, neutral liquid, and dry gas) for cleaning or etching the substrate W. As shown in FIG. 1, the first swing nozzle units 300 are arranged in parallel. Since distances from the processing bowl 100 to the respective first swing nozzle units 300 are all different, the first swing nozzle units 300 have different lengths according to radiuses of rotation thereof.

The first swing nozzle units 300 each include a nozzle part 300a disposed in the processing area, and a nozzle driver 300b disposed in the maintenance area and adapted to rotate in a θ-axis direction and move up and down in a z-axis direction.

The nozzle driver 300b includes a support shaft 382 in connection with a flange 340 of the nozzle part 300a, a swing driver 384, and an elevation driver 386. The swing driver 384 rotates the nozzle part 300a connected with the support shaft 382 so that the nozzle part 300a swings to the center of the substrate W. The swing driver 384 may be an assembly constructed by a motor, a belt, and a pulley. The elevation driver 386 supplies a driving force to linearly move the nozzle part 300a in a vertical direction. The elevation driver 386 may be a linear driving device such as a cylinder or a linear motor. The elevation driver 386 moves the nozzle part 300a up and down to prevent the nozzle part 300a from colliding with another adjoining nozzle part 300a during its rotation.

Hereinafter, the nozzle part of the swing nozzle unit will be described in detail with reference to the drawings.

Figure 4:
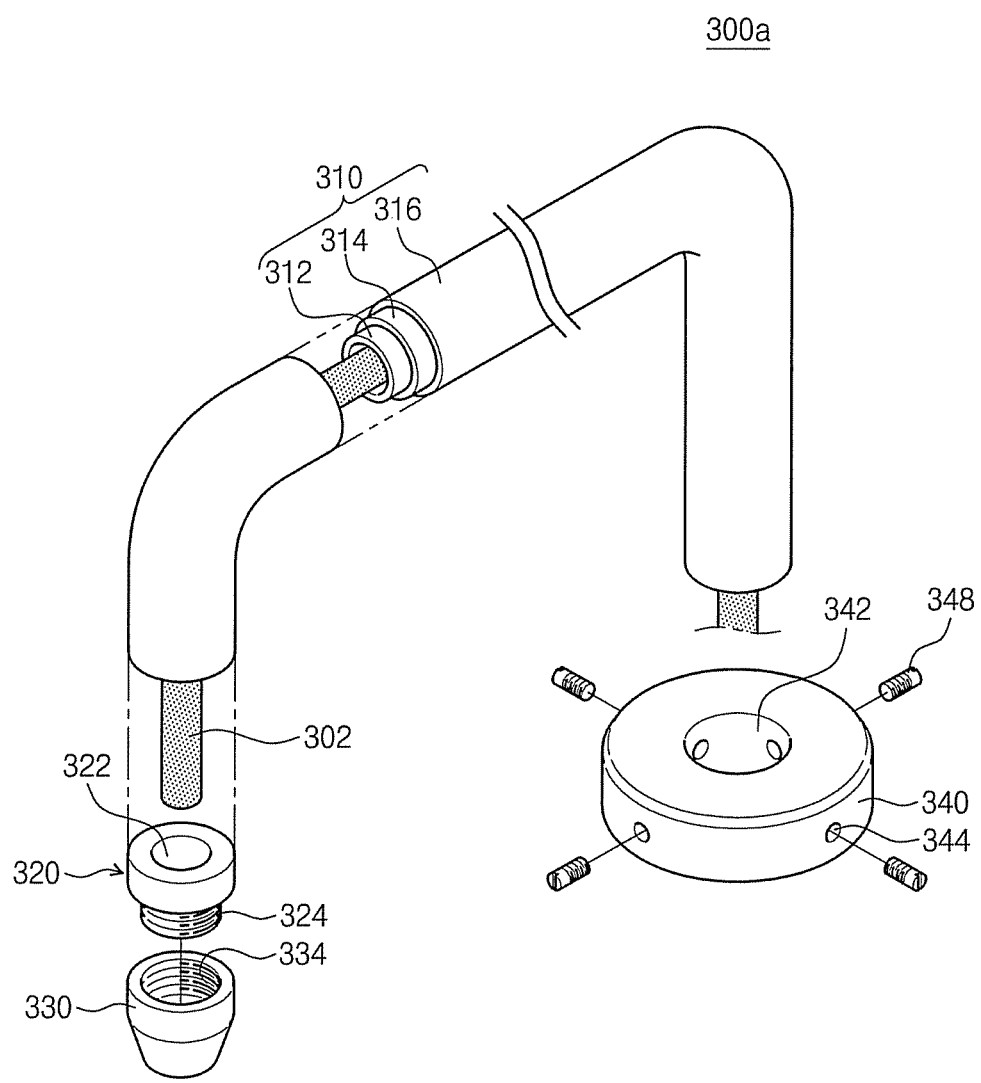
FIG. 4 is an exploded perspective view of a nozzle unit.
Figure 5:
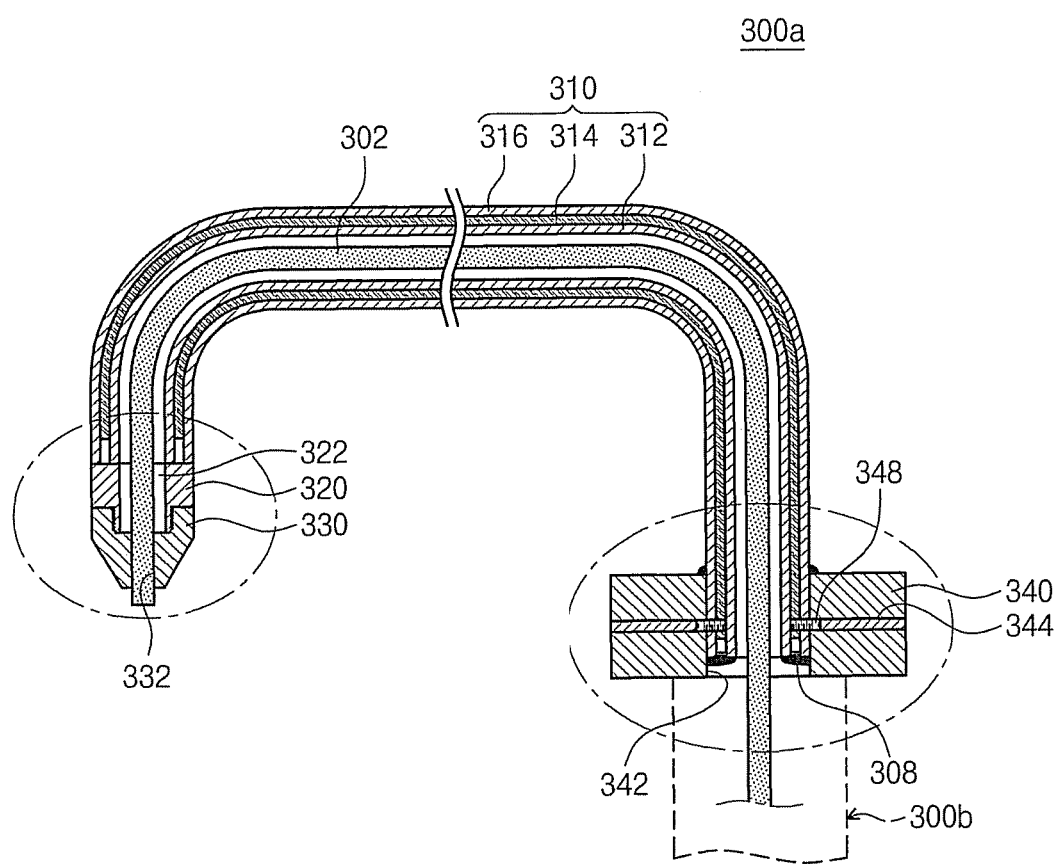
FIG. 5 is a sectional view of the nozzle unit.
Figure 6:
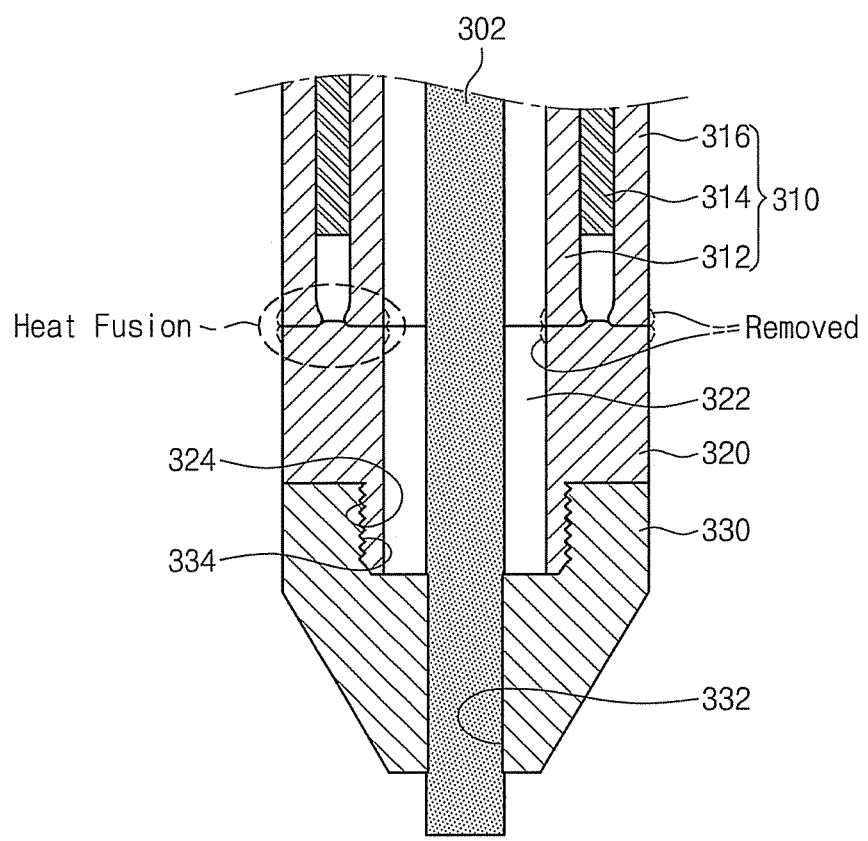
FIGS. 6 and 7 are enlarged views showing one end and the other end of the nozzle unit, respectively.
Figure 7:
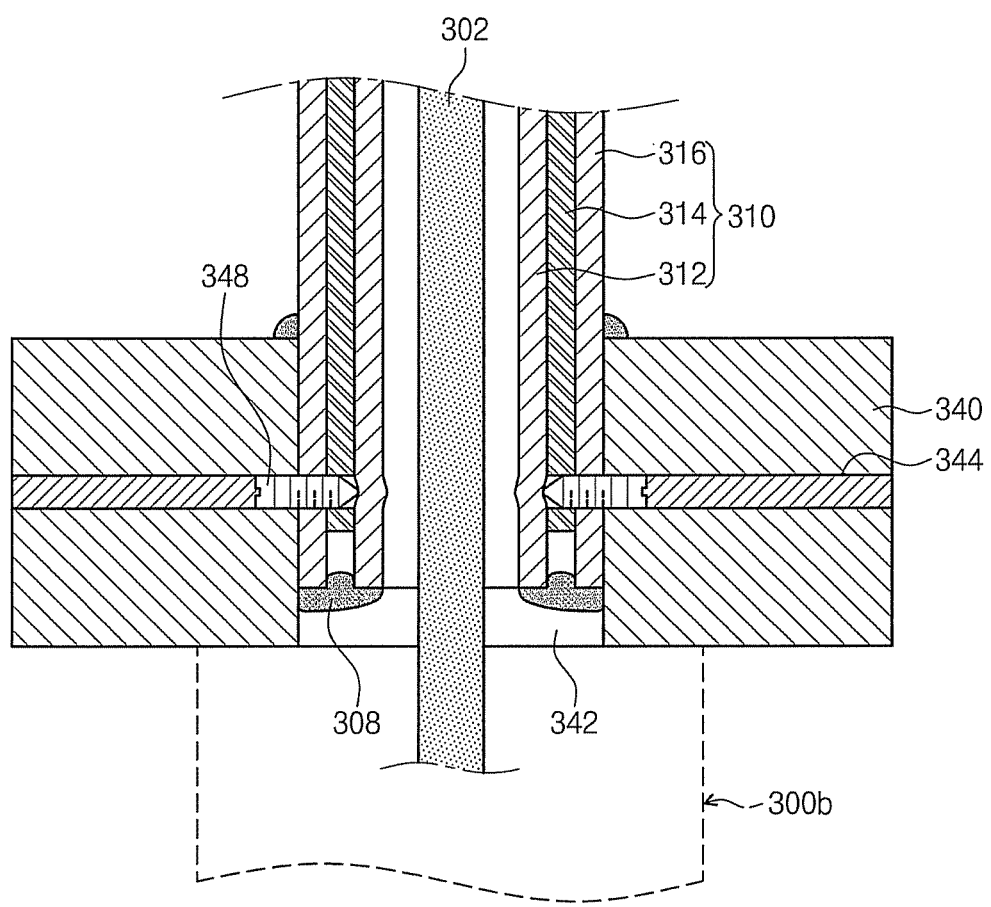

FIG. 4 is an exploded perspective view of a nozzle unit. FIG. 5 is a sectional view of the nozzle unit. FIGS. 6 and 7 are enlarged views showing one end and the other end of the nozzle unit, respectively.

Referring to FIGS. 4 through 7, the nozzle part 300a includes a nozzle body 310, a sealing cap 320, a nozzle tip 330, and the flange 340.

The nozzle body 310 has a triple pipe structure having an elongated rod structure to provide an inner path along which a processing fluid supply tube 302 is disposed. Specifically, the nozzle body 310 includes an inner resin pipe 312, a metal pipe 314 enclosing the inner resin pipe 312, and an outer resin pipe 316 enclosing the metal pipe 314. The inner resin pipe 312 and the outer resin pipe 316 are made of resin having high corrosion-resistance and exemplarily made of the same resin material as each other. The inner resin pipe 312 has a bit smaller outer diameter than an inner diameter of the metal pipe 314. The metal pipe 314 also has a bit smaller outer diameter than an inner diameter of the outer resin pipe 316. The metal pipe 314 is force-fit in the inner diameter of the outer resin pipe 316 applied with heat. The inner resin pipe 312 is force-fit in the inner diameter of the metal pipe 314. Accordingly, the nozzle body 310 having the triple pipe structure is achieved. It is exemplary that the metal pipe 314 is made of metal having high rigidity and high corrosion-resistance.

The sealing cap 320 is fixed to one end of the inner resin pipe 312 and one end of the outer resin pipe 316 by heat fusion so that one end of the metal pipe 314 is not exposed to the outside. Exemplarily, regarding one end of the nozzle body 310, one ends of the inner and the outer resin pipes 312 and 316 protrude more than one end of the metal pipe 314 for efficient fixing of the sealing cap 320 by heat fusion. In the same principle, at the other end of the nozzle body 310, it is exemplary that the other ends of the inner and the outer resin pipes 312 and 316 protrude more than the other end of the metal pipe 314. The sealing cap 320 includes a through hole 322 disposed in the center thereof to pass the processing fluid supply tube 302, and a male screw part 324 formed at a lower end thereof for screw connection of the nozzle tip 330. An outer diameter of the sealing cap 320 is equal to an outer diameter of the outer resin pipe 316. An inner diameter of the sealing cap 320, that is, a diameter of the through hole 322 is equal to an inner diameter of the inner resin pipe 312. Thus, one end of the metal pipe 314 is completely sealed by the sealing cap 320, thereby thoroughly preventing contact with the processing fluid and fume generated during the processing.

The nozzle tip 330 includes a female screw part 334 for engagement with the male screw part 324 of the sealing cap 320. The nozzle tip 330 includes a hole 332 having an inner diameter substantially equal to an outer diameter of the processing fluid supply tube 302 to hold the processing fluid supply tube 302. The processing fluid supply tube 302 is fixedly inserted in the hole 332 of the nozzle tip 330. One end of the processing fluid supply tube 302 protrudes from the nozzle tip 330.

The flange 340 is mounted to the other end of the nozzle body 310. The flange 310 is connected with a driver 300b. The flange 340 includes an insertion hole 342 for insertion of the other end of the nozzle body 310. The other end of the nozzle body 310 inserted in the insertion hole 342 of the flange 340 is sealed by resin welding 308 so that the metal pipe 314 is not exposed to the outside. The flange 340 includes a plurality of fastening holes 344 on a side surface thereof. Fixing members 348 are inserted in the fastening holes 344. Therefore, the other end of the nozzle body 310 inserted in the insertion hole 342 is fixed to the flange 340. The diameter of the insertion hole 342 is equal to the outer diameter of the outer resin pipe 316 of the nozzle body 310. The fixing members 348 may be screws inserted from the side surface of the flange 340 and fastened to the outer resin pipe 316 and the metal pipe 314 in a penetrating manner. By thus stably fixing the other end of the nozzle body 310 to the flange 340 using the screws, the nozzle body 310 is prevented from distorting during the swinging motion. However, the screws should not perforate the inner resin pipe 312. If the screws perforate the inner resin pipe 312, the processing fluid or the fume may infiltrate through gaps formed by the perforation and cause corrosion to the metal pipe 314. The fastening holes 344 in which the screws are inserted are filled with a finishing material.

As described above, the first swing nozzle unit 300 according to the embodiment may have sufficient rigidity as a small diameter pipe by including the metal pipe 314. Therefore, shake of the first swing nozzle unit 300 may be prevented during the swing operation. Especially, since the metal pipe 314 is protected by the inner and the outer resin pipes 312 and 316 while both ends are sealed by the sealing cap 320 and the resin welding 308, infiltration of the processing fluid is completely prevented. As a result, corrosion of the metal pipe is effectively prevented.

According to the embodiments, since rigidity and corrosion-resistance of a nozzle are improved, the nozzle size may be reduced. Also, shake of the nozzle may be prevented.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A swing nozzle unit comprising:
a nozzle part comprising a nozzle body in the form of a rod supplying an inner path where a processing fluid supply tube is disposed, the nozzle part includes a sealing cap and a nozzle tip, the sealing cap includes a through hole disposed in a center thereof to pass the processing fluid supply tube and is mounted to one end of the inner resin pipe and one end of the outer resin pipe so that one end of the metal pipe is not exposed to the outside, the nozzle tip is mounted to the sealing cap to hold the processing fluid supply tube,
wherein the nozzle body comprises:
an inner resin pipe;
a metal pipe disposed to surround the inner resin pipe; and
an outer resin pipe disposed to surround the metal pipe;
wherein the nozzle part further comprises a flange mounted to the other end of the nozzle body, and
wherein the swing nozzle unit further comprises a nozzle driver connected with the flange to rotate and move up and down the nozzle part.

2. The swing nozzle unit of claim 1, wherein the flange comprises an insertion hole to insert the other end of the nozzle body, and further comprises fixing members to fix the other end of the nozzle body inserted in the insertion hole.

3. The swing nozzle unit of claim 2, wherein the fixing members are screws engaged to the other end of the nozzle body from a side surface of the flange.

4. The swing nozzle unit of claim 3, wherein the screws are fastened by passing through the outer resin pipe and the metal pipe.

5. A substrate processing apparatus comprising:
a substrate support member comprising a spin head on which a substrate is placed;
a processing bowl disposed to surround the spin head and adapted to collect a processing fluid scattering from the substrate; and
swing nozzle units adapted to inject the processing fluid to the substrate placed on the spin head by rotating in a swinging motion,
wherein each of the swing nozzle unit comprises:
a nozzle part comprising a nozzle body constituted by an inner resin pipe supplying an inner path where a processing fluid supply tube is disposed, a metal pipe disposed to surround the inner resin pipe, and an outer resin pipe disposed to surround the metal pipe, the nozzle part includes a sealing cap and a nozzle tip, the sealing cap includes a through hole disposed in a center thereof to pass the processing fluid supply tube and is mounted to one end of the inner resin pipe and one end of the outer resin pipe so that one end of the metal pipe is not exposed to the outside, the nozzle tip is mounted to the sealing cap to hold the processing fluid supply tube; and
a nozzle driver adapted to rotate and move up and down the nozzle part.

6. The substrate processing apparatus of claim 5, wherein the sealing cap is made of the same resin material as the inner resin pipe and the outer resin pipe for efficient heat fusion with the inner resin pipe and the outer resin pipe.

7. The substrate processing apparatus of claim 5, wherein the nozzle part further comprises a nozzle tip which is connected with the sealing cap and comprises a fixing hole to insert and fix one end of the processing fluid supply tube therein.

8. The substrate processing apparatus of claim 5, wherein the nozzle part further comprises a flange mounted at the other end of the nozzle body,
wherein the flange comprises an insertion hole to insert the other end of the nozzle body, and further comprises screws to fix the other end of the nozzle body inserted in the insertion hole.

* * * * *